United States Patent
Salman et al.

(10) Patent No.: US 11,862,863 B2
(45) Date of Patent: Jan. 2, 2024

(54) CALIBRATION METHOD AND APPARATUS

(71) Applicant: Metawave Corporation, Carlsbad, CA (US)

(72) Inventors: Safa Kanan Hadi Salman, Vista, CA (US); Taha Shahvirdi Dizaj Yekan, San Diego, CA (US); Souren Shamsinejad, Carlsbad, CA (US); Maha Achour, Encinitas, CA (US)

(73) Assignee: Metawave Corporation, Carlsbad, CA (US)

( * ) Notice: Subject to any disclaimer, the term of this patent is extended or adjusted under 35 U.S.C. 154(b) by 616 days.

(21) Appl. No.: 16/829,803

(22) Filed: Mar. 25, 2020

(65) Prior Publication Data

US 2020/0395663 A1   Dec. 17, 2020

Related U.S. Application Data

(60) Provisional application No. 62/823,562, filed on Mar. 25, 2019.

(51) Int. Cl.
*H01Q 3/26*   (2006.01)
*H01Q 21/22*  (2006.01)
(Continued)

(52) U.S. Cl.
CPC ............. *H01Q 3/267* (2013.01); *H01Q 3/36* (2013.01); *H01Q 21/0025* (2013.01); *H01Q 21/22* (2013.01); *H04B 17/12* (2015.01)

(58) Field of Classification Search
CPC ........ H01Q 3/267; H01Q 1/1257; H01Q 3/26; H01Q 3/36; H01Q 3/2694; H01Q 21/00; H01Q 3/24; H01Q 3/34; H01Q 3/2605; H01Q 21/0025; H01Q 21/22; H04B 17/12; H04B 1/0475; H04B 7/0617; H04B 17/0085; H04B 17/318
See application file for complete search history.

(56) References Cited

U.S. PATENT DOCUMENTS 5,680,141 A  *  10/1997  Didomenico ......... H01Q 3/267
                                                    342/174
5,784,402 A  *   7/1998  Feher ..................... H04L 27/362
                                                    375/296

(Continued)

OTHER PUBLICATIONS

"Antenna Array Basics," CH 1 of Antenna Arrays: A Computational Approach by Randy L. Haupt, pp. 1-44, 2010.

(Continued)

*Primary Examiner* — Khanh C Tran

(57) ABSTRACT

Examples disclosed herein relate to an antenna calibration method for a beam steering radar. A first set of input voltages is determined for a plurality of phase shifters coupled to a plurality of antenna elements in an antenna array in the beam steering radar, the voltages to control phases of signals for transmission by the antenna array. A first set of input voltages is applied to the antenna array. Radiating signals resulting from the first set of input voltages are measured. Voltage and phase values for the plurality of phase shifters are iteratively optimized to determine voltage and phase value pairs that result in a desired gain for the antenna array. The voltage and phase value pairs are stored in a look-up-table in the beam steering radar.

16 Claims, 6 Drawing Sheets

(51) Int. Cl.
*H04B 17/12* (2015.01)
*H01Q 3/36* (2006.01)
*H01Q 21/00* (2006.01)

(56) References Cited

U.S. PATENT DOCUMENTS

| | | | |
|---|---|---|---|
| 6,043,790 | A | 3/2000 | Derneryd et al. |
| 6,172,642 | B1* | 1/2001 | DiDomenico ......... H01Q 3/267 |
| | | | 342/368 |
| 6,222,503 | B1 | 4/2001 | Gietema et al. |
| 2003/0112184 | A1* | 6/2003 | Jenabi ................ H01Q 21/0025 |
| | | | 343/700 MS |
| 2007/0159407 | A1* | 7/2007 | Bolle ................... H01Q 3/2676 |
| | | | 342/368 |
| 2015/0009069 | A1* | 1/2015 | Yun .................... H04B 7/18515 |
| | | | 342/368 |
| 2016/0087349 | A1 | 3/2016 | Lee et al. |
| 2017/0373363 | A1* | 12/2017 | Zhou ........................ H03H 7/18 |
| 2019/0348761 | A1* | 11/2019 | Miehle ................... H01Q 21/29 |

OTHER PUBLICATIONS

C. Balanis, et al. ,"Smart Antenna," in Introduction to Smart Antennas, 1st ed., San Rafael, CA, USA: Morgan & Claypool Publishers, Ch. 4, pp. 33-67, 2007.
H. Zhou et al., "Evolution of Satellite Communication Antennas on Mobile Ground Terminals," International Journal of Antennas and Propagation, vol. 2015, Article ID 436250, pp. 1-14, Jul. 2015.

* cited by examiner

CALIBRATION METHOD AND APPARATUS

CROSS-REFERENCE TO RELATED APPLICATIONS

This application claims priority from U.S. Provisional Application No. 62/823,562, titled "CALIBRATION METHOD AND APPARATUS," filed on Mar. 25, 2019, all of which is incorporated by reference herein.

BACKGROUND

Antenna systems are key to wireless systems, including communication systems and radar systems. They have the ability to generate high-frequency signals with required gain, beam-switching and so forth. An antenna system is calibrated to ensure proper operation. The calibration process involves measuring the accuracy of the antenna under different conditions and for a range of transmit/receive angles. Current antenna calibration methods not only are subject to uncertainty but are lengthy procedures that only increase with the size of an antenna array.

BRIEF DESCRIPTION OF THE DRAWINGS

The present application may be more fully appreciated in connection with the following detailed description taken in conjunction with the accompanying drawings, which are not drawn to scale and in which like reference characters refer to like parts throughout, and wherein.

DETAILED DESCRIPTION

A calibration method and apparatus for an antenna array is disclosed herein. Antenna calibration, as generally described, refers to the process of ensuring an antenna will produce accurate measurements and results. Calibration is used for antennas in a variety of applications, wherein calibration is used to ensure proper operation of an antenna system, such as in a system having a feed network that supplies an antenna array. The feed network provides different length paths to the different array portions, thereby introducing differences that may result in operational performance variances throughout the array. As the array, or subarrays, combine to form a radiation beam, these performance variances may impact the gain, angle with respect to boresight, side lobes and so forth.

Calibration systems are designed for the application, antenna construction and array specifics. In various implementations, antenna calibration is a process of supplying a series of transmission signals to an antenna array where each element of the array or portion of the array is tested for a range of operation. The voltage and phase of the transmission signals are varied and the resultant radiation signals are measured in the far-field. This may be performed in a closed system or in-situ type test setting. In one example implementation, antenna calibration performed to determine a series of voltages to apply phase shifters in a beam steering radar for autonomous driving applications. The beam steering radar is capable of generating narrow, directed beams that can be steered to any angle (i.e., from 0° to 360°) across a Field of View ("FoV") to detect objects. The beams are generated and steered in the analog domain, while processing of received radar signals for object identification is performed with advanced signal processing and machine learning techniques.

It is appreciated that the detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology. In other instances, well-known methods and structures may not be described in detail to avoid unnecessarily obscuring the description of the examples. Also, the examples may be used in combination with each other.

Figure 1A:
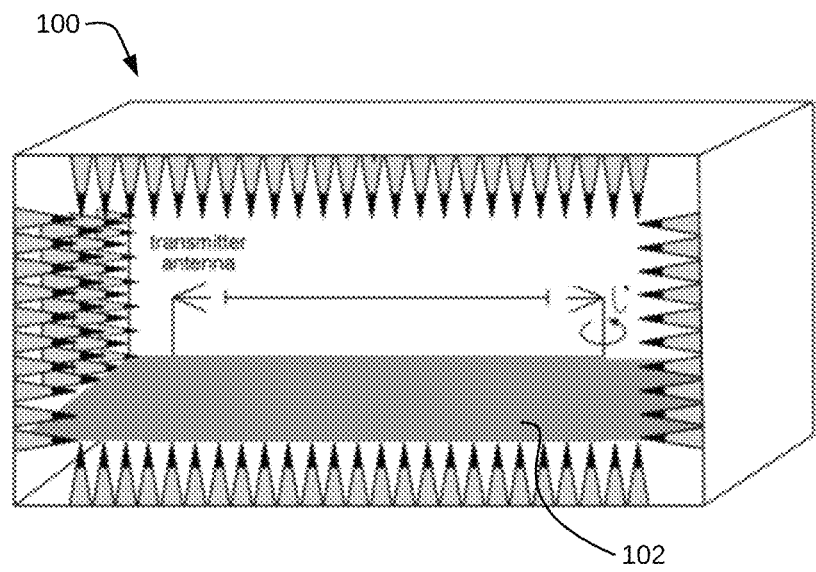
FIG. 1A and FIG. 1B illustrate a calibration configuration for an antenna system, according to one or more implementations of the subject technology; a calibration configuration for an antenna system, according to one or more implementations of the subject technology.

Referring now to FIG. 1A, a calibration configuration for an antenna system is described. Test system 100 is an anechoic chamber that absorbs reflections of electromagnetic waves and isolates signals from the surrounding environment. For an antenna calibration process, a transmitting antenna 102 is positioned at a distance from a receive antenna. Signals are radiated from the transmitting antenna 102 and the received signals are measured.

Figure 1B:
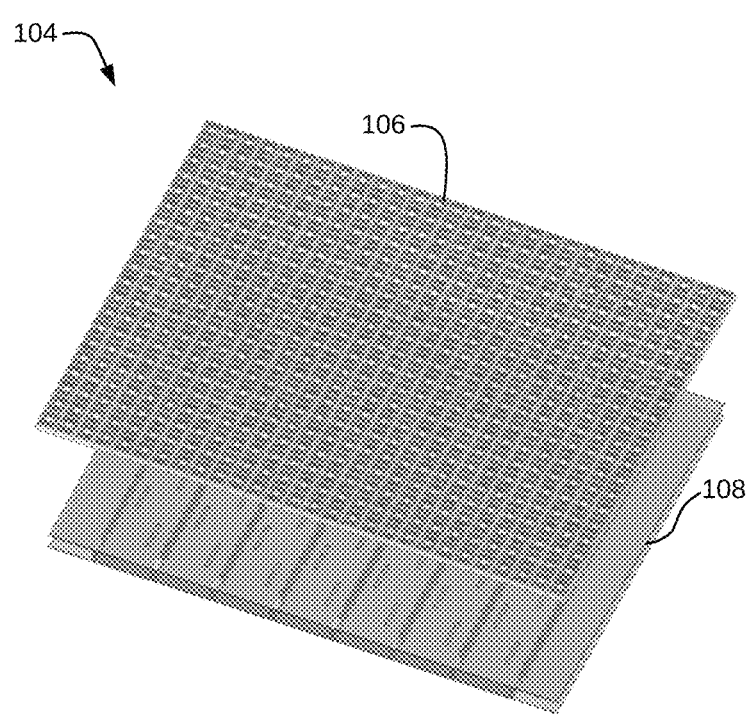

In an antenna array implementation illustrated in FIG. 1B, an array 104 includes multiple layers, where radiating elements are configured in an array on layer 106 and positioned over a slotted waveguide layer 108. The array 104 is adapted to generate signals for an electromagnetic system, such as a radar system for a vehicle. Radar signals are used to detect and identify objects in the path and environment of a vehicle. In some implementations, the antenna systems, radar systems and detection and identification methods are used to provide driver assist signals and information, such as in an Automated Driver Assist System ("ADAS"). Alternate applications include machinery, avionics and so forth, where the ability to detect objects in the path of the machine is needed. The applications incorporate transceiver functionality and antennas, with typically one or more antenna arrays used for transmissions while another one or more antenna arrays used for receipt of signals, such as echoes from the radar signals. The use of an antenna array involves power divider circuitry to provide one or more signals to the antenna unit for transmission over-the-air.

In automotive radar applications, the purpose is to transmit a signal of known parameters and determine a range, or distance, to an object, or target, as well as movement information, such as displacement from a position at a given time along with a trajectory over time. In some implementations, a radar unit can also provide acceleration information, with a radar cross-sectional area indicating a size of the object, a reflectivity of the object and so forth. From this information a classification engine is used to identify the target as a person, car, bicycle and so forth.

Figure 2:
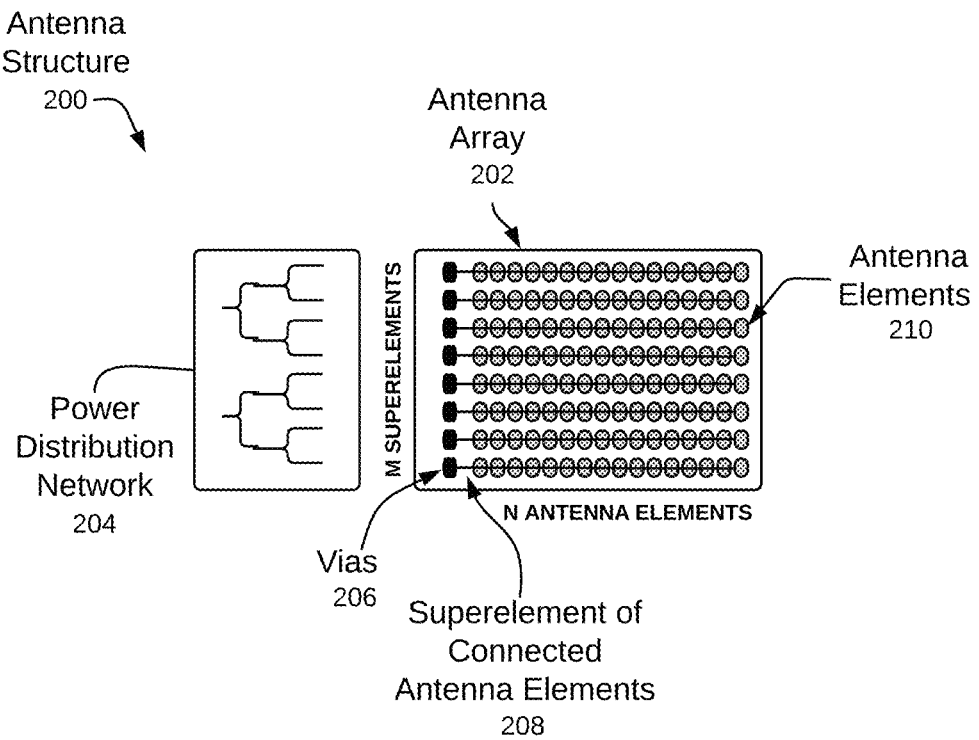
FIG. 2 illustrates an antenna array and feed network, according to one or more implementations of the subject technology.

FIG. 2 is an antenna system 200 having a power distribution network 204 which receives a transmission signal and feeds the signal through multiple paths to the antenna array 202. The antenna array 202 includes multiple antenna or radiating elements 210. The array 202 is configured with transmission lines 208 coupling multiple antenna elements 210. Each of the transmission lines 208 is coupled to one of the transmission paths of the power distribution network 204. There are multiple vias 206 positioned proximate one or more of the transmission lines 208 to couple to a slotted waveguide layer proximate (not shown). This example is not meant to be limiting, but rather to provide a full example of the application of the disclosed implementations. In the present example, the antenna system 200 may be positioned within a vehicle to comprehend the environment in which the vehicle is operating. In this way, the size, cost, power consumption, latency, footprint and so forth of the antenna system 200 determine application for use in a particular vehicle. These and other dimensions and parameters may be customized according to the use case.

Figure 3:
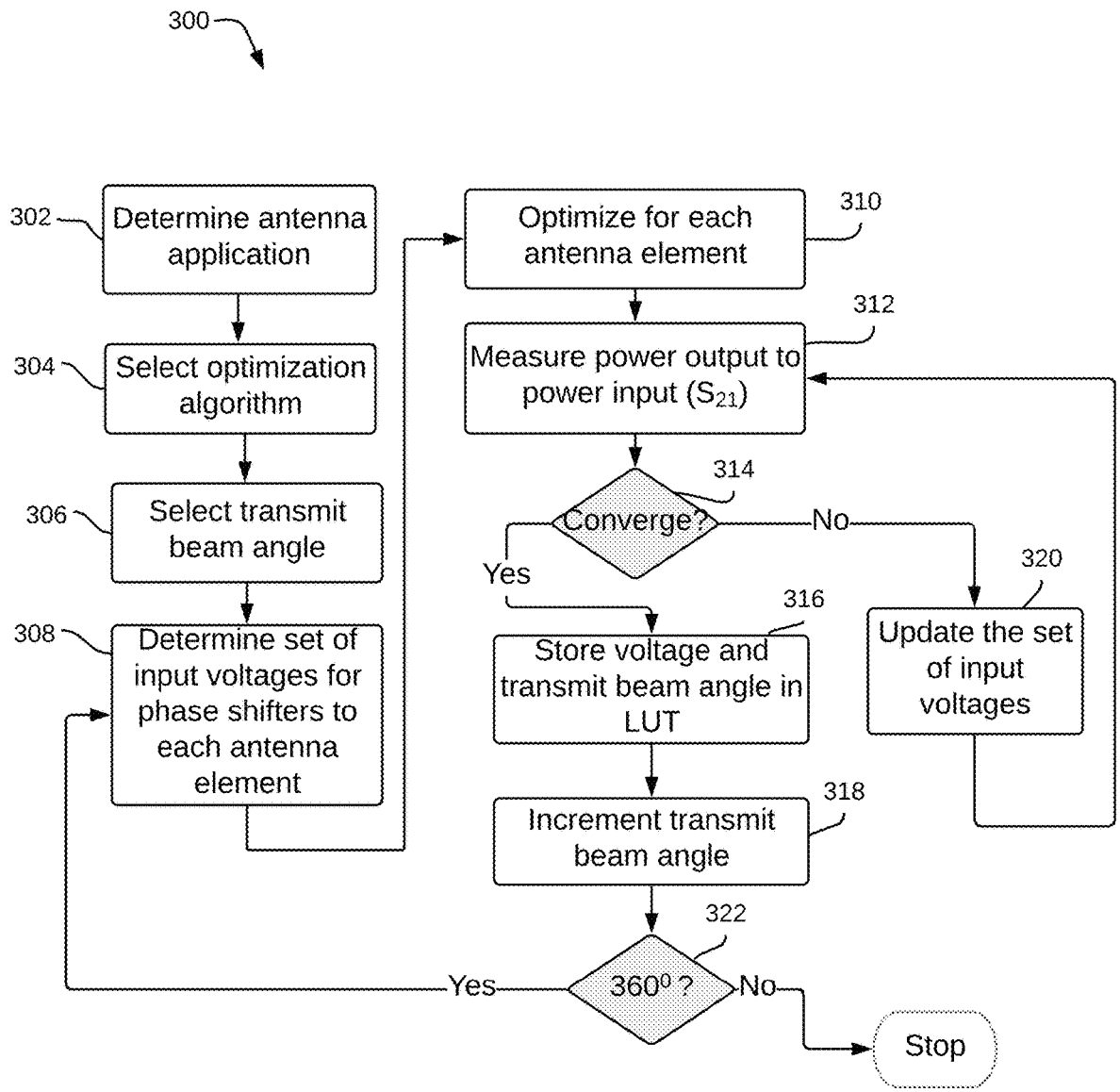
FIG. 3 illustrates an antenna calibration method, according to one or more implementations of the subject technology.

A method 300 for calibration of an antenna array is illustrated in FIG. 3 starting by determining an application for the antenna (302). The process then selects an appropriate optimization algorithm based on the antenna array, the antenna system and the application (304). The optimization algorithm may be a known optimization algorithm, modification thereof, or a custom designed algorithm, including, without limitation, a gradient descent algorithm, a genetic algorithm, a particle swarm method, and so forth. In one example implementation, the gradient descent algorithm can be used to calibrate an antenna array for a beam steering radar, as described in more detail herein below. This enables the method 300 to identify an insertion loss and accommodate voltage and phase values for phase shifters in the beam steering radar accordingly. There is a relationship between insertion loss and voltage offset for a given phase shift. In a noisy environment, convergence may be difficult to achieve, but by adjusting the initial conditions, and applying the proper parameters of the algorithm, the chances of convergence can be improved.

Calibration generally includes a linear array of N antenna elements. In the present implementations, the antenna is an antenna array of M sets of N connected antenna elements, wherein the antenna array may be linear, structured, or other design, and wherein the N antenna elements of each of the M sets are electrically connected. The model for calibration determines a theoretical pattern for each element or each array set, and also an ideal pattern for beams formed therefrom. The model and optimization algorithms are selected and designed from these patterns. The antenna must operate as specified over a range of transmission angles. There is also an array of angles to be transmitted from the antenna, as each of these must conform to the antenna specifications.

For example, there may be a good match between measured and ideal patterns at a first angle but a poor match at a second angle. The antenna must perform within specification across all angles in the specified range. The calibration is intended to determine settings that compensate for noise, uneven distance paths, and coupling between elements. In some implementations, voltage control and input, as well as non-idealities of the phase shift method, such as active components, affect the complex amplitudes of processed signals. There are many other conditions and parameters of a manufactured antenna system that may cause operation to deviate from the ideal operation. Some calibration measurements consider a correlation function to determine antenna transmission properties, such as side lobe measures. As there are a variety of antenna structures and applications, these may each have their own specific or desired optimization algorithm that works well for each situation and use case.

In the example implementation where a gradient descent optimization algorithm is used, the change in results of the measured radiation iteratively moves in the direction of steepest descent, along a negative gradient. Gradient-descent is thus one example method to determine a set of input voltages and phases that result in the signal meeting the desired criteria for a beam steering radar. Typically, such criteria include gain, $S_{21}$, side lobe level, transmit/receive angles and so forth, such as to find the set of values that results in a low input impedance between the power division portion and antenna elements. The learning rate of such an optimization algorithm is determined by the input set of values, the antenna system configuration, application, convergence threshold and so forth. An optimization algorithm model uses various parameters to make decisions and the success of a given model is measured by its cost function, which indicates how the model performs in predicting a given set of parameters.

Calibration testing starts with the selection of a first transmit beam angle (306). The process determines a set of input voltages (308) for controlling phase shifters to each antenna element, such as phase shifters in a beam steering radar as described in more detail below. In this example, each input voltage produces a given phase shift angle. This initiates the testing and the algorithm optimizes the voltage and phase shift for each antenna element (310), wherein the signal is received at a measurement unit, e.g., a receive antenna (312). This is implemented by first testing an initial pool of voltages and calculating an error measure. The next pool of voltages is selected based on the combination that gives the least error. The measurement calculation is for power output-to-power input, $S_{21}$, of the resultant radiation beam measured at the receive antenna. The process applies the set of input voltages iteratively to converge on a maximum gain solution for each power distribution path. When a set of input voltages converges (314), the voltage values and corresponding transmit beam angles are stored (316), such as, for example, at a Look-Up Table ("LUT"). The process then continues to increment the transmit beam angle (318), through all of the desired transmit beam angles, where angles are measured in steps. In some implementations, the transmit beam angle has a 360° range and the measurements take 2° steps.

If the measured $S_{21}$, does not converge (314), processing continues to update the set of input voltages (320), returning to step 312. A convergence criteria or threshold may be predetermined according to application, use, parameters of operation and so forth. The convergence criteria for each angle determines when the set of input voltage values is at an optimum point sufficient for operation.

Figure 4:
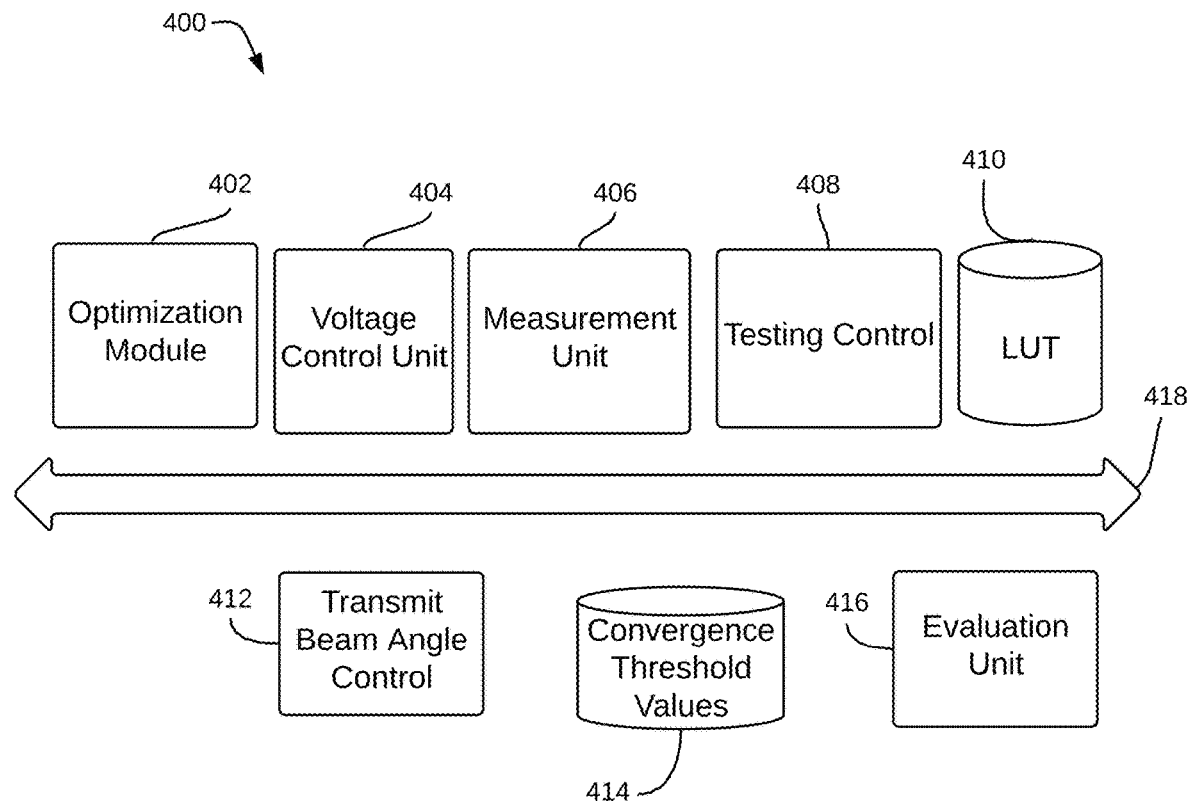
FIG. 4 illustrates an antenna system, according to one or more implementations of the subject technology.

FIG. 4 is an antenna system 400 having calibration capabilities with variable modules communicating through bus 418. The calibration process employs an optimization module 402 operational to determine input voltages and phase value sets. The testing control module 408 determines the test voltages, sets up the testing and communicates with other modules in the system 400. The measurement unit 406 measures received signals and provides data to evaluation unit 416. The voltage control unit 404 is responsible for implementing the voltage set and the transmit beam angle control 412 controls the angle under test, both of these operating under direction of the testing control module 408. The data of input voltages set for transmission and the measured received values of the measurement unit 406 are stored in LUT 410 on convergence of the optimization algorithm and are stored for later retrieval in actual operation. In this way, when the antenna system is in operation, a desired transmission angle is mapped to a set of input voltages. The system 400 also includes convergence threshold values 414 storing values used in optimization processing.

Figure 5:
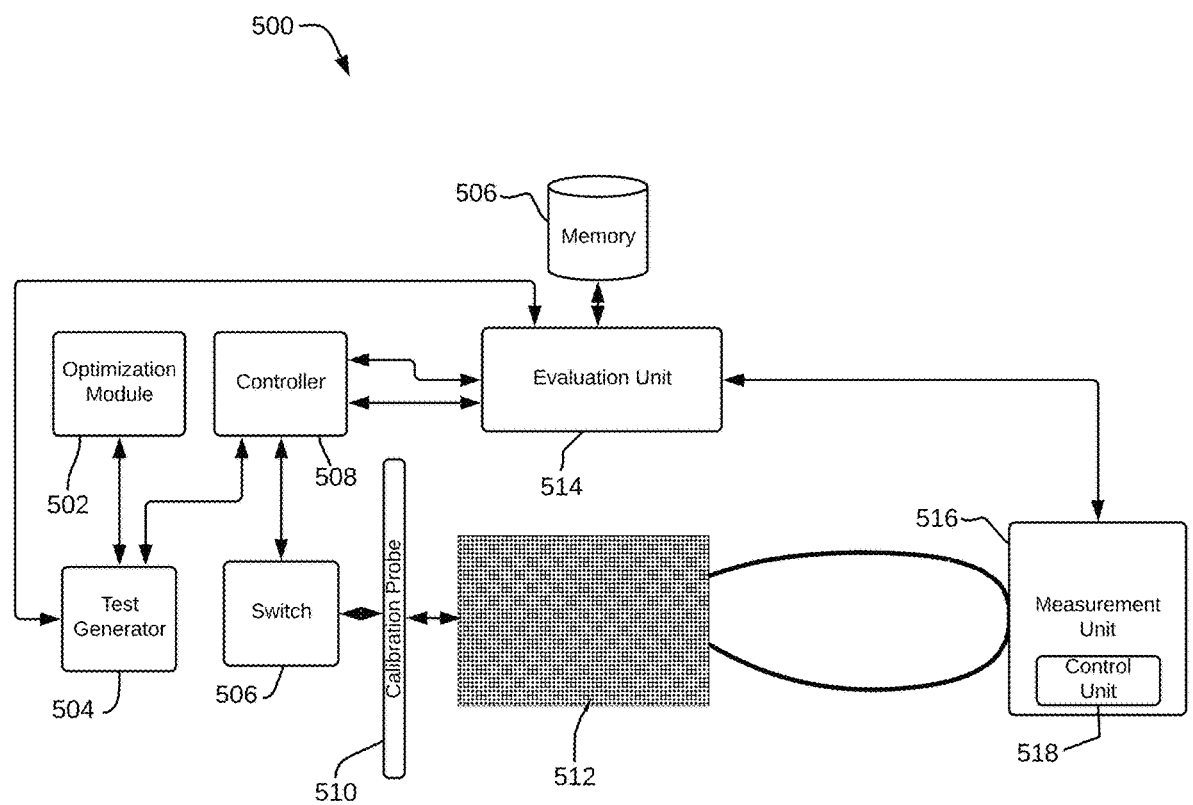
FIG. 5 illustrates an antenna array calibration system, according to one or more implementations of the subject technology.

FIG. 5 illustrates a calibration system 500 or testing an antenna array 512. A test generator 504 controls the set of voltages to input to the antenna array 512. A calibration probe 510 is configured to provide input to the antenna array 512, which may also include a feed network or power division circuit as in FIG. 2. The probe 510 is coupled to a switch 506 that determines which portions of the antenna array 512 are under test. In some implementations, the calibration probe 510 is coupled to each of the antenna elements in the antenna array 512 and therefore a switch is not used. In other examples, the switch 506 enables probes to couple to one or more antenna elements. The optimization algorithm is stored and controlled by optimization module 502. Controller 508 controls operation of the calibration system 500, including evaluation unit 514 and test generator 504, which implements algorithms from optimization module 502.

The measurement unit 516 measures the transmit signal from antenna array 512, and is controlled by an internal control unit 518. The results of measurement are provided to evaluation unit 514 and used to determine convergence of the algorithm. System 500 may employ any of a variety of optimization algorithms, including some of those described herein. The optimization module 502 selects the algorithm, then instructs the test generator 504 as to input voltage sets and convergence criteria.

In some implementations, the antenna array 512 includes a power division circuit, also referred to as a feed structure, and may include impedance matching elements coupled to the transmission array elements, such as transmission lines or other structures incorporating radiating elements. The impedance matching element may be configured to match the input signal parameters with radiating elements, and therefore, there are a variety of configurations and locations for this element, which may include a plurality of components.

Figure 6:
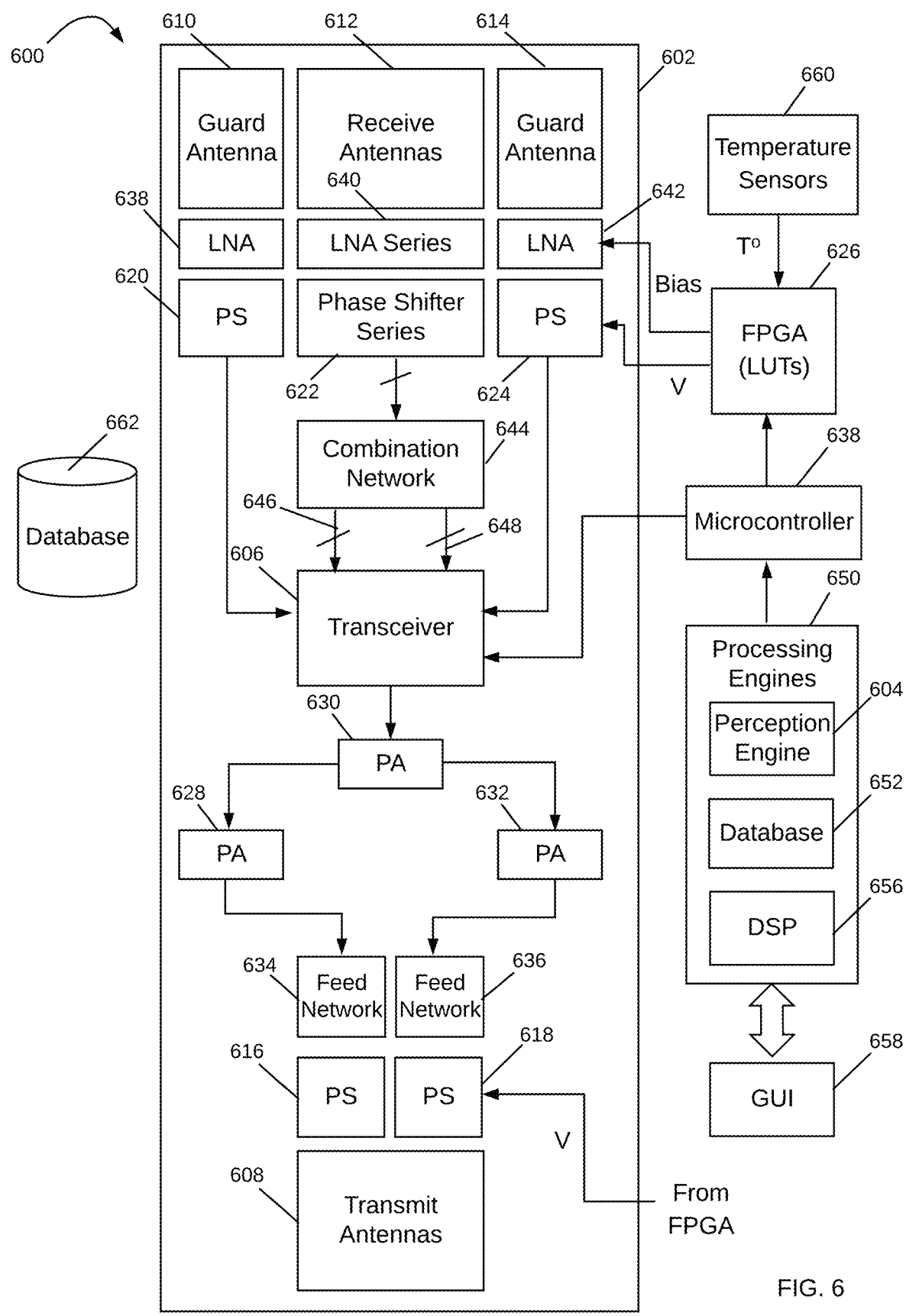
FIG. 6 illustrates a schematic diagram of a beam steering radar system in accordance with various implementations of the subject technology.

Attention is now directed to FIG. 6, which illustrates a schematic diagram of a beam steering radar system in accordance with various examples. Beam steering radar 600 is a "digital eye" with true 3D vision and capable of a human-like interpretation of the world. The "digital eye" and human-like interpretation capabilities are provided by two main modules: radar module 602 and a perception engine 604. Radar module 602 is capable of both transmitting RF signals within a FoV and receiving the reflections of the transmitted signals as they reflect off of objects in the FoV. With the use of analog beamforming in radar module 602, a single transmit and receive chain can be used effectively to form a directional, as well as a steerable, beam. A transceiver 606 in radar module 602 is adapted to generate signals for transmission through a series of transmit antennas 608 as well as manage signals received through a series of receive antennas 610-614. Beam steering within the FoV is implemented with phase shifter ("PS") circuits 616-618 coupled to the transmit antennas 608 on the transmit chain and PS circuits 620-624 coupled to the receive antennas 610-614 on the receive chain, respectively. Careful phase and amplitude calibration of transmit antennas 608 and receive antennas 610-614 can be performed as described above with reference to FIGS. 3-5. The goal of calibration is to match voltages input into PS circuits 616-618 and 620-624 to corresponding phase shift angles.

The use of PS circuits 616-618 and 620-624 enables separate control of the phase of each element in the transmit and receive antennas. Unlike early passive architectures, the beam is steerable not only to discrete angles but to any angle (i.e., from 0° to 360°) within the FoV using active beamforming antennas. A multiple element antenna can be used with an analog beamforming architecture where the individual antenna elements may be combined or divided at the port of the single transmit or receive chain without additional hardware components or individual digital processing for each antenna element. Further, the flexibility of multiple element antennas allows narrow beam width for transmit and receive. The antenna beam width decreases with an increase in the number of antenna elements. A narrow beam improves the directivity of the antenna and provides the radar 600 with a significantly longer detection range.

The major challenge with implementing analog beam steering is to design PSs to operate at 77 GHz. PS circuits 616-618 and 620-624 solve this problem with a reflective PS design implemented with a distributed varactor network currently built using GaAs materials. Each PS circuit 616-618 and 620-624 has a series of PSs, with each PS coupled to an antenna element to generate a phase shift value of anywhere from 0° to 360° for signals transmitted or received by the antenna element. The PS design is scalable in future implementations to SiGe and CMOS, bringing down the PS cost to meet specific demands of customer applications. Each PS circuit 616-618 and 620-624 is controlled by a Field Programmable Gate Array ("FPGA") 626, which provides a series of voltages to the PSs in each PS circuit that results in a series of phase shifts.

In various examples, a voltage value is applied to each PS in the PS circuits 616-618 and 620-624 to generate a given phase shift and provide beam steering. The voltages applied to the PSs in PS circuits 616-618 and 620-624 are stored in LUTs in the FPGA 606. These LUTs are generated by an antenna calibration process as described above with reference to FIGS. 3-5 that determines which voltages to apply to each PS to generate a given phase shift under each operating condition. Note that the PSs in PS circuits 616-618 and 620-624 are capable of generating phase shifts at a very high resolution of less than one degree. This enhanced control over the phase allows the transmit and receive antennas in radar module 602 to steer beams with a very small step size, improving the capability of the radar 600 to resolve closely located targets at small angular resolution.

In various examples, the transmit antennas 608 and the receive antennas 610-614 may be a meta-structure antenna, a phase array antenna, or any other antenna capable of radiating RF signals in millimeter wave frequencies. A meta-structure, as generally defined herein, is an engineered structure capable of controlling and manipulating incident radiation at a desired direction based on its geometry. Various configurations, shapes, designs and dimensions of the antennas 608-614 may be used to implement specific designs and meet specific constraints, such as, for example, antenna 104 of FIG. 1 and antenna 202 of FIG. 2.

The transmit chain in radar 600 starts with the transceiver 606 generating RF signals to prepare for transmission over-the-air by the transmit antennas 608. The RF signals may be, for example, Frequency-Modulated Continuous Wave ("FMCW") signals. An FMCW signal enables the radar 600 to determine both the range to an object and the object's velocity by measuring the differences in phase or frequency between the transmitted signals and the received/reflected signals or echoes. Within FMCW formats, there are a variety of waveform patterns that may be used, including sinusoidal, triangular, sawtooth, rectangular and so forth, each having advantages and purposes.

Once the FMCW signals are generated by the transceiver 606, they are provided to power amplifiers ("PAs") 628-632. Signal amplification is needed for the FMCW signals to reach the long ranges desired for object detection, as the signals attenuate as they radiate by the transmit antennas 608. From the PAs 628-632, the signals are divided and distributed through feed networks 634-636, which form a power divider system to divide an input signal into multiple signals, one for each element of the transmit antennas 608. The feed networks 634-636 may divide the signals so power is equally distributed among them or alternatively, so power is distributed according to another scheme, in which the divided signals do not all receive the same power. Each signal from the feed networks 634-636 is then input into a PS in PS circuits 616-618, where they are phase shifted based on voltages generated by the FPGA 626 under the direction of microcontroller 638 and then transmitted through transmit antennas 608.

Microcontroller 638 determines which phase shifts to apply to the PSs in PS circuits 616-618 according to a desired scanning mode based on road and environmental scenarios. Microcontroller 638 also determines the scan parameters for the transceiver to apply at its next scan. The scan parameters may be determined at the direction of one of the processing engines 650, such as at the direction of perception engine 604. Depending on the objects detected, the perception engine 604 may instruct the microcontroller 638 to adjust the scan parameters at a next scan to focus on a given area of the FoV or to steer the beams to a different direction.

In various examples and as described in more detail below, radar 600 operates in one of various modes, including a full scanning mode and a selective scanning mode, among others. In a full scanning mode, both transmit antennas 608 and receive antennas 610-614 scan a complete FoV with small incremental steps. Even though the FoV may be limited by system parameters due to increased side lobes as a function of the steering angle, radar 600 is able to detect objects over a significant area for a long range radar. The range of angles to be scanned on either side of boresight as well as the step size between steering angles/phase shifts can be dynamically varied based on the driving environment. To improve performance of an autonomous vehicle (e.g., an ego vehicle) driving through an urban environment, the scan range can be increased to keep monitoring the intersections and curbs to detect vehicles, pedestrians or bicyclists. This wide scan range may deteriorate the frame rate (revisit rate), but is considered acceptable as the urban environment generally involves low velocity driving scenarios. For a high-speed freeway scenario, where the frame rate is critical, a higher frame rate can be maintained by reducing the scan range. In this case, a few degrees of beam scanning on either side of the boresight would suffice for long-range target detection and tracking.

In a selective scanning mode, radar 600 scans around an area of interest by steering to a desired angle and then scanning around that angle. This ensures the radar 600 is to detect objects in the area of interest without wasting any processing or scanning cycles illuminating areas with no valid objects. Since the radar 600 is capable of detecting objects at a long distance, e.g., 300 m or more at boresight, if there is a curve in a road, direct measures do not provide helpful information. Rather, the radar 600 steers along the curvature of the road and aligns its beams towards the area of interest. In various examples, the selective scanning mode may be implemented by changing the chirp slope of the FMCW signals generated by the transceiver 306 and by shifting the phase of the transmitted signals to the steering angles needed to cover the curvature of the road.

Objects are detected with radar 600 by reflections or echoes that are received at the series of receive antennas 610-614, which are directed by PS circuits 620-624. Low Noise Amplifiers ("LNAs) are positioned between receive antennas 610-614 and PS circuits 620-624, which include PSs similar to the PSs in PS circuits 616-618. For receive operation, PS circuits 610-624 create phase differentials between radiating elements in the receive antennas 610-614 to compensate for the time delay of received signals between radiating elements due to spatial configurations. Receive phase-shifting, also referred to as analog beamforming, combines the received signals for aligning echoes to identify the location, or position of a detected object. That is, phase shifting aligns the received signals that arrive at different times at each of the radiating elements in receive antennas 610-614. Similar to PS circuits 616-618 on the transmit chain, PS circuits 620-624 are controlled by FPGA 626, which provides the voltages to each PS to generate the desired phase shift. FPGA 626 also provides bias voltages to the LNAs 638-642.

The receive chain then combines the signals received at receive antennas 612 at combination network 644, from which the combined signals propagate to the transceiver 606. Note that as illustrated, combination network 644 generates two combined signals 646-648, with each signal combining signals from a number of elements in the receive antennas 612. In one example, receive antennas 612 include 48 radiating elements and each combined signal 646-648 combines signals received by 24 of the 48 elements. Other examples may include 8, 16, 24, 32, and soon, depending on the desired configuration. The higher the number of antenna elements, the narrower the beam width.

Note also that the signals received at receive antennas 610 and 614 go directly from PS circuits 620 and 624 to the transceiver 606. Receive antennas 610 and 614 are guard antennas that generate a radiation pattern separate from the main beams received by the 48 element receive antenna 612. Guard antennas 610 and 614 are implemented to effectively eliminate side-lobe returns from objects. The goal is for the guard antennas 610 and 614 to provide a gain that is higher than the side lobes and therefore enable their elimination or reduce their presence significantly. Guard antennas 610 and 614 effectively act as a side lobe filter.

Once the received signals are received by transceiver 606, they are processed by processing engines 650. Processing engines 650 include perception engine 604 which detects and identifies objects in the received signal with neural network and artificial intelligence techniques, database 652 to store historical and other information for radar 600, and a Digital Signal Processing ("DSP") engine 654 with an Analog-to-Digital Converter ("ADC") module to convert the analog signals from transceiver 606 into digital signals that can be processed to determine angles of arrival and other valuable information for the detection and identification of objects by perception engine 604. In one or more implementations, DSP engine 654 may be integrated with the microcontroller 638 or the transceiver 606.

Radar 600 also includes a Graphical User Interface ("GUI") 658 to enable configuration of scan parameters such as the total angle of the scanned area defining the FoV, the beam width or the scan angle of each incremental transmission beam, the number of chirps in the radar signal, the chirp time, the chirp slope, the chirp segment time, and so on as desired. In addition, radar 600 has a temperature sensor 660 for sensing the temperature around the vehicle so that the proper voltages from FPGA 626 may be used to generate the desired phase shifts. The voltages stored in FPGA 626 are determined during calibration of the antennas under different operating conditions, including temperature conditions. A database 662 may also be used in radar 600 to store radar and other useful data.

The present disclosure provides methods and apparatuses for calibration of an antenna array, such as in a beam steering radar in automotive applications or in wireless communications, having an array of radiating elements and a feed structure. The feed structure distributes the transmission signal throughout the transmission array, wherein the transmission signal propagates along the rows of the transmission array and discontinuities are positioned along each row. The calibration applies an optimization algorithm to prepare a set of input voltages for a variety of transmission angles. The algorithm avoids the prior calibration methods that tested a large number of combinations to determine operation of an antenna.

It is appreciated that the beam steering radar system described herein above supports autonomous driving with improved sensor performance, all-weather/all-condition detection, advanced decision-making algorithms and interaction with other sensors through sensor fusion. These configurations optimize the use of radar sensors, as radar is not inhibited by weather conditions in many applications, such as for self-driving cars. The radar described here is effectively a "digital eye," having true 3D vision and capable of human-like interpretation of the world.

The previous description of the disclosed examples is provided to enable any person skilled in the art to make or use the present disclosure. Various modifications to these examples will be readily apparent to those skilled in the art, and the m spirit or scope of the disclosure. Thus, the present disclosure is not intended to be limited to the examples shown herein but is to be accorded the widest scope consistent with the principles and novel features disclosed herein.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Furthermore, to the extent that the term "include," "have," or the like is used in the description or the claims, such term is intended to be inclusive in a manner similar to the term "comprise" as "comprise" is interpreted when employed as a transitional word in a claim.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. Moreover, the separation of various system components in the aspects described above should not be understood as requiring such separation in all aspects, and it should be understood that the described program components and systems can generally be integrated together in a single hardware product or packaged into multiple hardware products. Other variations are within the scope of the following claim.

What is claimed is:

1. An antenna calibration method for a beam steering radar, comprising:
determining a first set of input voltages for a plurality of phase shifters coupled to a plurality of antenna elements in an antenna array in the beam steering radar, the voltages to control phases of signals for transmission by the antenna array;
applying the first set of input voltages to the antenna array;
measuring radiating signals resulting from the first set of input voltages;

selecting an optimization algorithm from a gradient descent algorithm, a genetic algorithm, or a particle swarm algorithm;

iteratively optimizing voltage and phase values for the plurality of phase shifters to determine voltage and phase value pairs that result in a desired gain for the antenna array; and storing the voltage and phase value pairs in a look-up-table in the beam steering radar, wherein iteratively optimizing voltage and phase values comprises applying the first set of input voltages to the antenna array to converge on a maximum gain for a power distribution path from a plurality of power distribution paths in the antenna array.

2. The antenna calibration method of claim 1, wherein measuring radiating signals resulting from the first set of input voltages comprises measuring power outputs to power inputs which are defined as $S_{21}$ values for the radiating signals at a receive antenna array, wherein $S_{21}$ is a gain of power output to power input of a radiation bema measured at the receive antenna array.

3. The antenna calibration method of claim 2, wherein the power distribution path comprises a transmission path in the antenna array coupled to a power distribution network.

4. The antenna calibration method of claim 1, wherein the look-up-table is stored in a FPGA coupled to the plurality of phase shifters in the beam steering radar.

5. An antenna calibration system for use with a beam steering radar, comprising:

an optimization means to determine operational voltages for a plurality of phase shifters coupled to an antenna array in the beam steering radar, the antenna array having a plurality of antenna elements;

a test generator means to control a set of input voltages for the antenna array;

a measurement means adapted to receive signals transmitted from the antenna array;

a calibration probe configured to provide input to the antenna array;

an evaluation means coupled to the measurement means; and a storage means coupled to the evaluation means adapted to store the operational voltages and corresponding transmit angles, wherein the optimization means is to select an optimization algorithm from a gradient descent algorithm, a genetic algorithm, or a particle swarm algorithm.

6. The antenna calibration system of claim 5, further comprising a switch coupled to the calibration probe to select antenna elements from the plurality of antenna elements to calibrate at a time.

7. The antenna calibration system of claim 5, wherein the measurement means is to measure power outputs to power inputs and such measures are defined as $S_{21}$ values for radiating signals at a receive antenna array, the radiating signals resulting from application of the set of input voltages to the antenna array, wherein $S_{21}$ is a gain of power output to power input of a radiation beam measured at the receive antenna array.

8. The antenna calibration system of claim 5, wherein the evaluation means is to evaluate a convergence criteria for the optimization algorithm.

9. The antenna calibration system of claim 8, wherein the convergence criteria comprises a maximum gain for each power distribution path in the antenna array.

10. The antenna calibration system of claim 9, wherein a power distribution path comprises a transmission path in the antenna array coupled to a power distribution network.

11. An antenna calibration method for operation of a beam steering radar, comprising:

iteratively optimizing voltage and phase values for a plurality of phase shifters coupled to a plurality of antenna elements in an antenna array in the beam steering radar to determine voltage and phase value pairs that result in a desired gain for the antenna array;

storing the voltage and phase value pairs in a look-up-table in the beam steering radar;

applying a set of voltages from the voltage and phase value pairs to the plurality of phase shifters to generate a set of phase shifts corresponding to the set of voltages in the voltage and phase value pairs; and radiating a plurality of RF beams with the set of phase shifts at the antenna array, wherein iteratively optimizing voltage and phase values comprises applying a first set of input voltages to the antenna array to converge on a maximum gain for each power distribution path in the antenna array, wherein the convergence criteria comprises a maximum gain for each power distribution path in the antenna array.

12. The antenna calibration method of claim 11, wherein storing the voltage and phase value pairs in a look-up table in the beam steering radar comprises storing the look-up-table in a FPGA coupled to the plurality of phase shifters.

13. The antenna calibration method of claim 11, further comprising amplifying the plurality of RF beams before radiating the plurality of RF beams with the set of phase shifts at the antenna array.

14. The antenna calibration method of claim 11, wherein the antenna array comprises a meta-structure antenna.

15. The antenna calibration method of claim 11, wherein the plurality of phase shifters comprises a plurality of reflective phase shifters comprising distributed varactor networks.

16. The antenna method as in claim 11 further comprising providing calibration probe values as input for an antenna array.

* * * * *